(12) United States Patent
Lee et al.

(10) Patent No.: US 7,670,025 B2
(45) Date of Patent: Mar. 2, 2010

(54) BACKLIGHT MODULE

(75) Inventors: Kuo-Chih Lee, Hsinchu (TW);
Sheng-Chieh Chen, Hsinchu (TW);
Chia-Hung Sun, Hsinchu (TW);
Huang-Ti Lin, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 46 days.

(21) Appl. No.: 11/954,545

(22) Filed: Dec. 12, 2007

(65) Prior Publication Data
US 2009/0009993 A1    Jan. 8, 2009

(30) Foreign Application Priority Data
Jul. 3, 2007    (TW) ............... 96124118 A

(51) Int. Cl.
*F21V 23/02* (2006.01)

(52) U.S. Cl. ................... 362/221; 362/217.09; 362/225

(58) Field of Classification Search ............... 362/29, 362/30, 97.2, 217.09, 217.15, 221, 225, 630, 362/631, 632, 633, 634
See application file for complete search history.

(56) References Cited

U.S. PATENT DOCUMENTS

| | | | |
|---|---|---|---|
| 1,862,503 A * | 6/1932 | Cadieux ............... | 362/216 |
| 6,986,598 B2 | 1/2006 | Chu et al. | |
| 7,380,958 B2 * | 6/2008 | Jeong ............... | 362/225 |
| 2004/0233663 A1 * | 11/2004 | Emslie et al. ............... | 362/221 |
| 2006/0120103 A1 | 6/2006 | Lin | |
| 2006/0286831 A1 | 12/2006 | Kwon et al. | |
| 2007/0058376 A1 | 3/2007 | Suzuki | |
| 2008/0143920 A1 * | 6/2008 | Back et al. ............... | 362/632 |

FOREIGN PATENT DOCUMENTS

| | | |
|---|---|---|
| CN | 1441286 | 9/2003 |
| CN | 1549031 | 11/2004 |
| CN | 1609677 | 4/2005 |
| CN | 1881030 | 12/2006 |
| CN | 1928665 | 3/2007 |
| JP | 2000-284311 | 10/2000 |
| TW | M 273013 | 8/2005 |

OTHER PUBLICATIONS

English language translation of abstract of M 273013.
Chinese language office action dated Jun. 6, 2008.

* cited by examiner

*Primary Examiner*—Y My Quach Lee
(74) *Attorney, Agent, or Firm*—Thomas, Kayden, Horstemeyer & Risley

(57) ABSTRACT

A backlight module comprising a back bezel, at least one light emitting device, a first circuit board, and a second circuit board is provided. The light emitting device, which has an electrode, is disposed on the side of the back bezel, while the first circuit board is disposed on the edge of the back bezel. An elastic clip is used to electrically connect the first circuit board directly with the electrode of the light emitting device, while the second circuit board is electrically connected to the first circuit board.

11 Claims, 5 Drawing Sheets

BACKLIGHT MODULE

This application claims the benefits of the priority based on Taiwan Patent Application No. 096124118, filed on Jul. 3, 2007; the disclosures of which are incorporated by reference herein in their entirety.

CROSS-REFERENCES TO RELATED APPLICATIONS

Not applicable.

BACKGROUND OF THE INVENTION

1. Field of the Invention

The present invention relates to a backlight module. More particularly, the invention relates to a direct-emission type backlight module applied to a liquid crystal display (LCD) device.

2. Descriptions of the Related Art

With the progress of science and technology, LCD devices have progressively replaced conventional display devices in the display device market. Generally, an LCD device comprises key components such as the liquid crystal panel and backlight module. The individual pixels on the liquid crystal panel are controlled to allow the light to pass through to determine the bright or dark state of each pixel under the illumination of light emitted from the backlight module.

FIG. 1 illustrates a conventional direct-emission type backlight module, which comprises a plurality of tubes 103 disposed on the surface of a back bezel 101 as the light source of the backlight module. In particular, each of the tubes 103 has an electrode 105 disposed on one end thereof, and a circuit board 107 is typically disposed on the other surface of the back bezel 101 opposite the tubes 103. A conductor 109 electrically connects the electrode 105 with the circuit board 107 using a splice or a welding process, so that the tubes 103 are driven and controlled to function as the light source of the backlight module.

Unfortunately, the conventional backlight module has the following disadvantages: (1) the conductor used to connect the circuit board with the electrodes of the tubes will increase the cost; (2) the connection process of the conductor is adopted a splice or a welding process, so apart from the increased cost attributed to the splice or the welding materials, the manufacturing process is too complex; (3) the transformer incorporated in the circuit board 107 will lead to a thicker backlight module and thereby, increasing the overall thickness of the final product, which is unfavorable in today's demand for a thinner LCD device.

Therefore, it is important to provide a backlight module that can overcome the above deficiencies.

SUMMARY OF THE INVENTION

One objective of this invention is to provide a backlight module, which has the first circuit including a transformer being disposed separately from the second circuit. In particular, the first circuit board with a certain thickness is disposed at the edge of the back bezel. In this way, the overall thickness of the backlight module will be reduced effectively.

Another objective of this invention is to provide a backlight module, wherein a circuit board is electrically directly connected to the electrode of a light emitting device. As a result, the conductor and splicing materials will be eliminated, thus reducing the manufacturing costs. Furthermore, with such a novel structure, the assembly process of the backlight module may be adjusted to reduce the complexity of the manufacturing process.

The backlight module disclosed in this invention comprises a back bezel, at least one light emitting device, a first circuit board and a second circuit board. The back bezel has a first surface, a second surface opposite to the first surface, a first edge and a second edge perpendicular to the first edge. The light emitting device has an electrode and is disposed on the first surface of the back bezel. The first circuit board is disposed at the first edge of the back bezel, wherein the first circuit board is directly connected electronically to the electrode of the light emitting device. The second circuit board is in turn electrically connected to the first circuit board.

The detailed technology and preferred embodiments implemented for the subject invention are described in the following paragraphs accompanying the appended drawings for the people skilled in this field to well appreciate the features of the claimed invention.

DESCRIPTION OF THE PREFERRED EMBODIMENT

Figure 1:
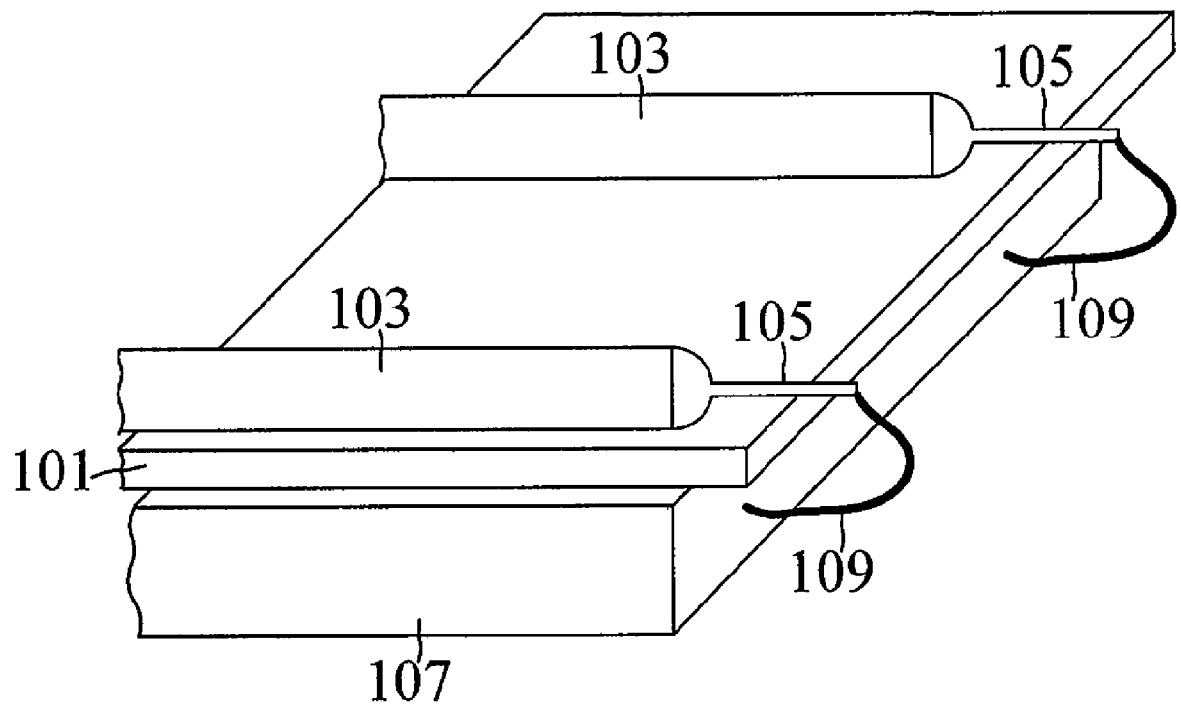
FIG. 1 is a schematic view of a conventional backlight module.
Figure 2A:
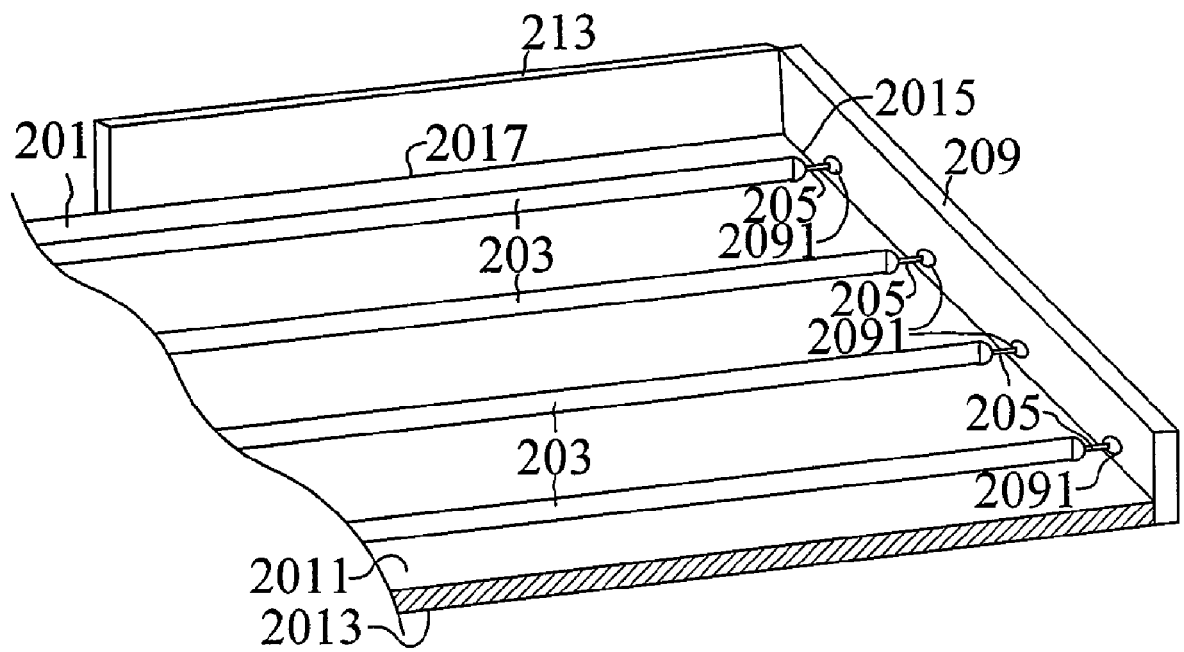
FIG. 2A is a schematic view of a first embodiment in accordance with this invention.

The first embodiment of a backlight module in accordance with this invention will be described hereinafter. Referring to FIG. 2A, the backlight module comprises a plurality of tubes 203, which are disposed on the first surface 2011 of a back bezel 201 to serve as the light source of the backlight module. The tubes 203 disclosed in this invention are not limited to straight tubes as shown in FIG. 2A. The other shape types of tubes are also acceptable, for example, U-shaped tubes. Each of the tubes 203 has an electrode 205 disposed adjacent to the first edge 2015 of the back bezel 201. The electrode 205 is electrically connected to the first circuit board 209, and the first circuit board 209 supplies electric power into the tubes 203 via the electrode 205 and enables the tubes 203 to emit light. In one embodiment, the first circuit board 209 is, for example, a circuit board being formed with a balanced circuit.

Figure 2B:
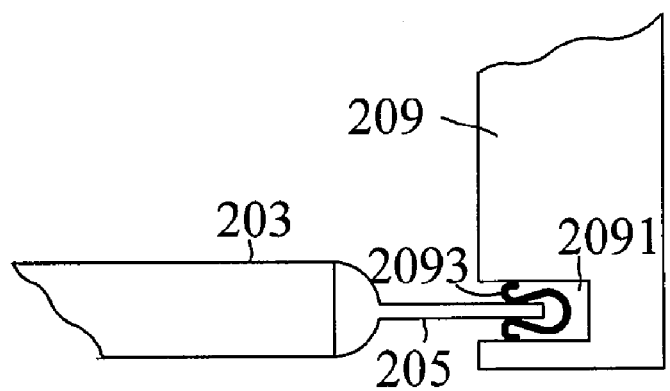
FIGS. 2B and 2C are schematic views of an elastic clip clipping the end of the electrode in the backlight module in accordance with this invention.
Figure 2C:
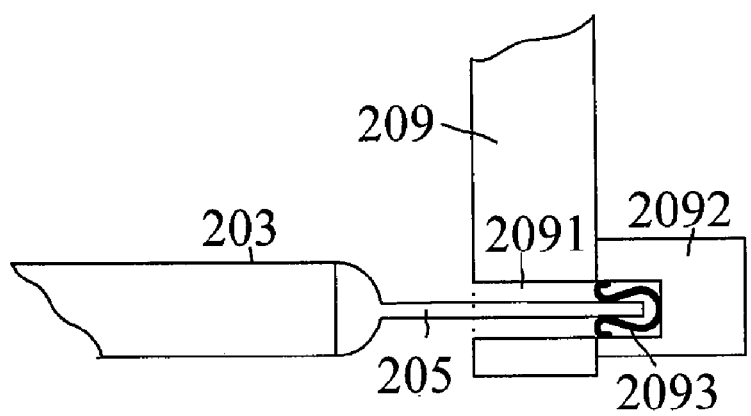

The first circuit board 209 is disposed on the first edge 2015 of the back bezel 201, and is preferably perpendicular to the back bezel 201. Compared to the conventional connecting means such as welded or conductor connection, the electrode 205 of this invention is electrically connected to the first circuit board 209 directly, so that the conductor or joining materials are eliminated. In reference to FIG. 2B, the first circuit board 209 has a slot 2091, and an elastic clip 2093 is embedded within the slot 2091 to clip the electrode 205 of the tube 203. More particularly, as shown in FIG. 2C, the first circuit board 209 has a transformer 2092 disposed thereon, and the elastic clip 2093 may in turn be disposed on the transformer 2092. In this way, the elastic clip 2093 may be used to clip the electrode 205 of the tube 203 to make a direct electrical connection and eliminate the connecting conductor.

Figure 2D:
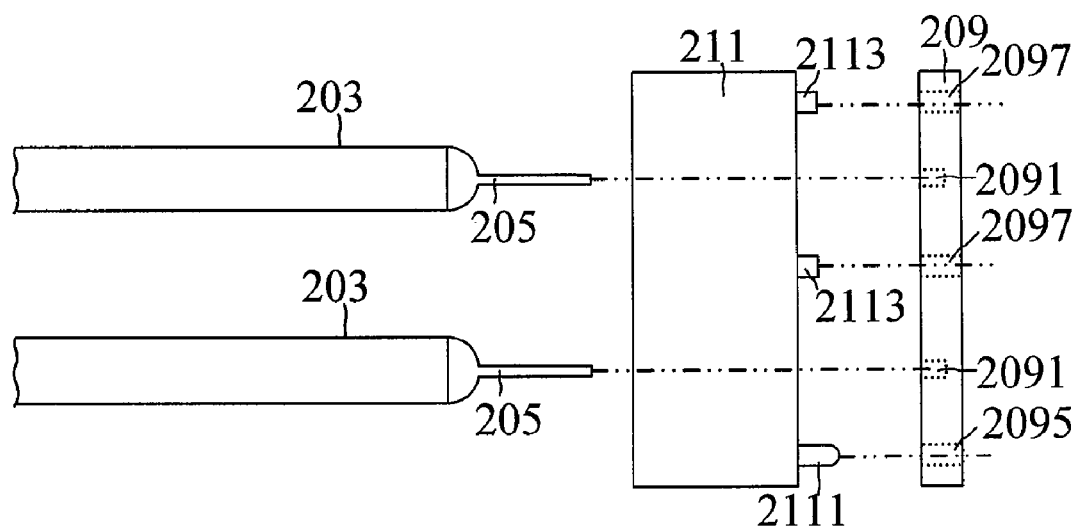
FIG. 2D is a schematic view of an assembled backlight module in accordance with this invention.

As shown in FIG. 2D, at least one locating pin 2111 and at least one fixing hook 2113 may be disposed on the tube holder 211 in the actual manufacturing process to increase the convenience of first circuit board 209 assembly. Because such structures may be formed integrally during the manufacturing process of the tube holder 211, the space occupied and the materials needed may be reduced. To accommodate for the structure of the locating pin 2111 and the fixing hook 2113, at least one locating hole 2095 and at least one fixing hole 2097 are disposed on the first circuit board 209 correspondingly.

In this embodiment, when installing the first circuit board 209, the tube holder 211 incorporating the locating pin 2111 and the fixing hook 2113 is first disposed at the end of the tube 203 adjacent to the electrode 205. Due to the locating hole 2095 of the first circuit board 209 along with the corresponding locating pin 2111 of the tube holder 211, the fixing hole 2097 of the first circuit board 209 and the fixing hook 2113 of the tube holder 211, are connected to each other readily and securely. At the same time, the locating slot 2091 of the first circuit board 209 clips the electrode 205 of the tube 203 with the aid of the elastic clip 2093. In this way, the assembly process thereof may be considerably simplified, and the assembling efficiency and accuracy may be improved.

Figure 3:
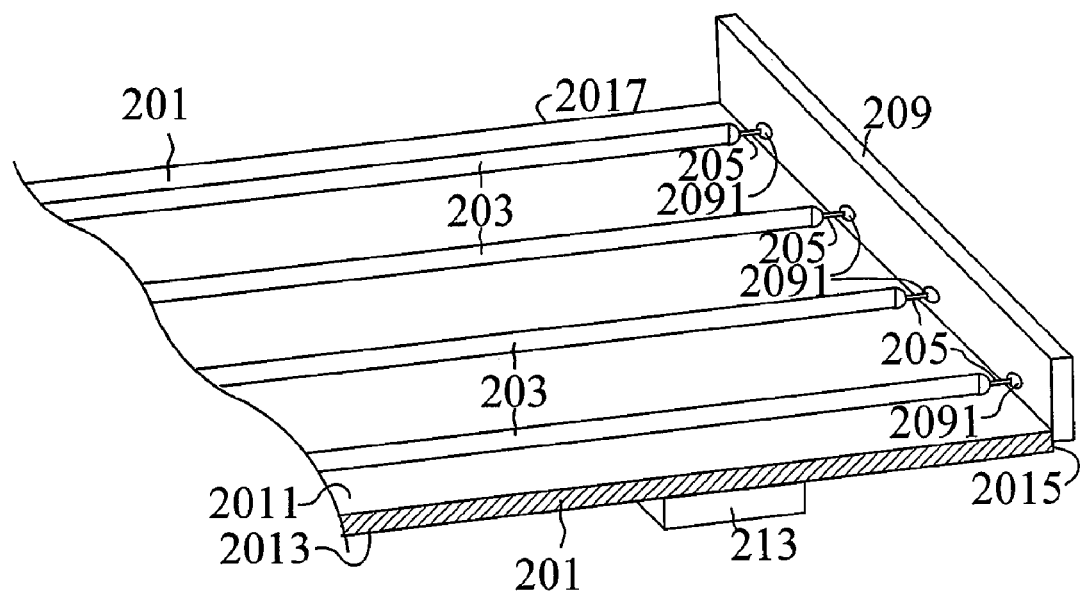
FIG. 3 is a schematic view of another aspect of the first embodiment in accordance with this invention.

As shown in FIG. 2A again, the second circuit board 213 is disposed at the second edge 2017 of the back bezel 201, substantially perpendicularly to the back bezel 201. The second circuit board 213 and the first circuit board 209 that are disposed separately from each other may be electrically connected to each other in any known manner, for example, by means of a board to board connection, a conductor connection or by welding. Alternatively, the second circuit board 213 may also be disposed on the second surface 2013 of the back bezel 201 opposite to the tube, as shown in FIG. 3. In one embodiment, the second circuit board 213 is, for example, a control circuit board.

In accordance with the above disclosure, changes can be made to the configuration of the first circuit board 209 and the second circuit board 213, as well as the height of the first circuit board 209 and the second circuit board 213, to further reduce the overall thickness of the backlight module.

Figure 4:
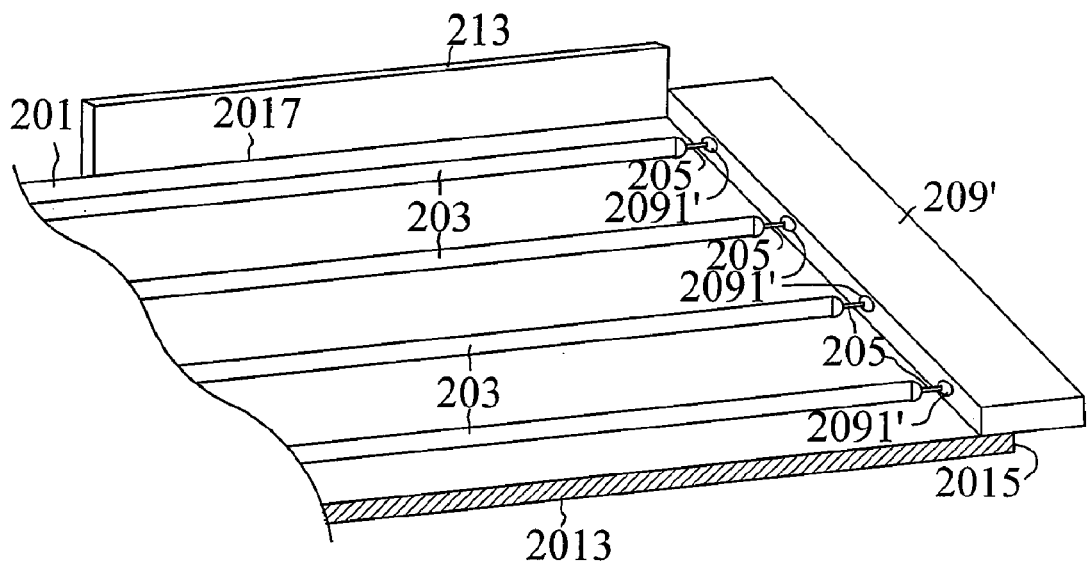
FIG. 4 is a schematic view of a second embodiment in accordance with this invention.

The second embodiment of the backlight module in accordance with this invention is illustrated in FIG. 4. In this embodiment, a first circuit board 209' is disposed on the first edge 2015 of the back bezel 201 in parallel to the back bezel 201. Moreover, the configuration of the locating slot 2091' of the first circuit board 209' is adjusted appropriately, so that the elastic clip (not shown) within the locating slot 2091' is clipped to the electrode 205. At this time, the second circuit board 213 is configured separately from the first circuit board 209', and is disposed on the second edge 2017 of the back bezel 201 perpendicularly to the back bezel 201. Of course, the second circuit board 213 may alternatively be disposed on the second surface 2013 of the back bezel 201 opposite to the tubes, in a manner similar to that shown in FIG. 3. Similarly, the second circuit board 213 and the first circuit board 209' may be electrically connected to each other in any known manner, for example, by means of a board to board connection, a conductor connection or by welding.

Figure 5:
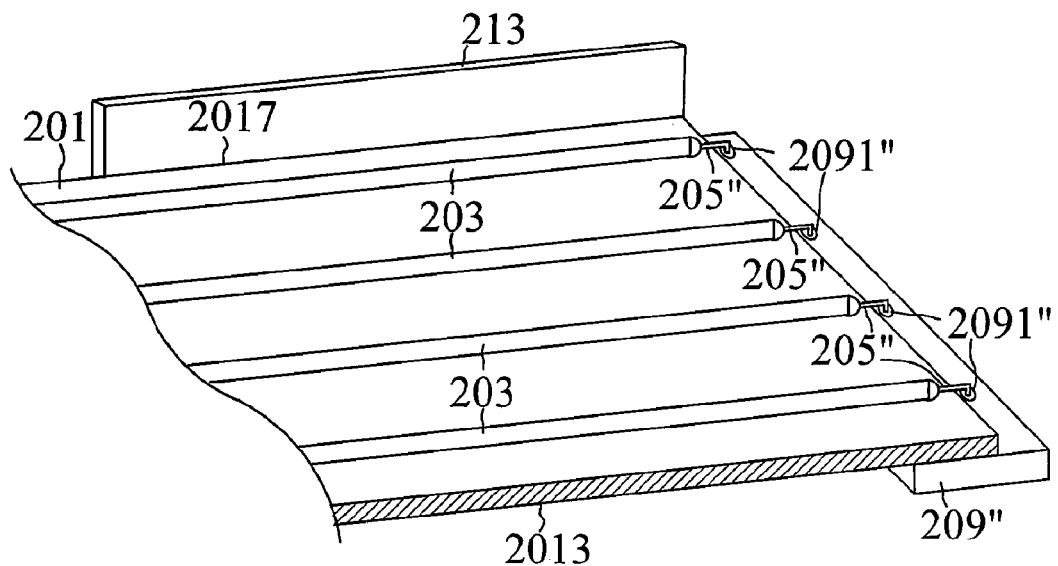
FIG. 5 is a schematic view of a third embodiment in accordance with this invention.

The third embodiment of the backlight module in accordance with this invention is illustrated in FIG. 5. In this embodiment, the first circuit board 209" is disposed on the second surface 2013 of the back bezel 201 on the edge opposite to the tubes, and is substantially parallel to the back bezel 201. A plurality of electrodes 205" may be bended appropriately to a certain angle to make it easier for the elastic clips (not shown) within the locating slots 2091" of the first circuit board 209" to clip the end of the electrodes 205". Likewise, the second circuit board 213 may be disposed on the second edge 2017 of the back bezel 201 perpendicularly to the back bezel 201, or alternatively be disposed on the second surface 2013 of the back bezel 201 opposite to the tubes, which will not be described in more detail herein.

The embodiments described above are only intended to describe the inventive concept of this invention, rather than to limit the scope of this invention, and those of ordinary skill in the art may certainly make appropriate modifications thereto. For example, instead of a cathode ray tube or a fluorescent tube, a lamp strip incorporating light emitting diodes (LEDs) may also be used for the tubes 203. Furthermore, additional components may be incorporated for other purposes, for example, an insulation film or an insulation plate may be disposed between the first circuit board 209 and the back bezel 201 or between the second circuit board 213 and the back bezel 201 to prevent short-circuiting between the first circuit board 209 or the second circuit board 213 and the back bezel 201.

In summary, this invention has a first circuit incorporating a transformer disposed separately from the second circuit, and has a first circuit board electrically connected to a plurality of tubes directly, without conductors needed to connect the first circuit board with the electrodes of the tubes. Therefore, this invention can be used in a backlight module structure effectively to reduce the number of conductors and the overall thickness of the backlight module. Moreover, elimination of the complex conductor connections as used in the prior art may reduce the complexity and cost of the manufacturing process thereof, resulting in a greater competitiveness of the product. By disposing the first circuit board and the second circuit board appropriately, the volume of the display device may be further reduced.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A back light module comprising:
   a back bezel having a first surface, a second surface opposite to the first surface, a first edge and a second edge perpendicular to the first edge;
   at least one light emitting device having an electrode and being disposed onto the first surface of the back bezel;
   a first circuit board disposed at the first edge of the back bezel, wherein the first circuit board comprises at least one transformer and at least one elastic clip which is disposed within a locating slot formed in the at least one transformer, the first circuit board directly, electrically connecting to the electrode when the at least one elastic clip clips the electrode; and
   a second circuit board electrically connecting to the first circuit board.

2. The back light module as claimed in claim 1, wherein the electrode is a bended electrode having a bending angle, in which the bended electrode has an end clipped within the locating slot.

3. The back light module as claimed in claim 2, wherein the first circuit board is disposed onto the second surface of the back bezel and adjacent to the first edge.

4. The back light module as claimed in claim 1, wherein the second circuit board is disposed adjacent to the second edge.

5. The back light module as claimed in claim 1, wherein the second circuit board is disposed onto the second surface of the back bezel.

6. The back light module as claimed in claim 1, wherein the first circuit board is formed with a balanced circuit.

7. The back light module as claimed in claim 1, wherein the second circuit board is a control circuit board.

8. The back light module as claimed in claim 1, further comprising a tube holder disposed on the light emitting device at an end thereof approaching to the electrode, wherein the tube holder has at least one locating pin and the first circuit board has at least one locating hole corresponding to the at least one locating pin.

9. The back light module as claimed in claim 1, further comprising a tube holder disposed at an end of the light emitting device approaching to the electrode, wherein the tube holder has at least one fixing hook and the first circuit board has at least one fixing hole corresponding to the at least one fixing hook.

10. The back light module as claimed in claim 1, wherein the light emitting device includes a cathode ray tube or a fluorescent tube.

11. The back light module as claimed in claim 1, wherein the light emitting device includes a U-shaped tube or a straight tube.

* * * * *